United States Patent [19]
Ikeda et al.

[11] Patent Number: 5,893,759
[45] Date of Patent: Apr. 13, 1999

[54] SEMICONDUCTOR DEVICE AND METHOD OF FABRICATING THE SAME

[75] Inventors: Tatsuhiko Ikeda; Shunji Kubo; Masao Yamawaki; Yasuki Yoshihisa, all of Hyogo, Japan

[73] Assignee: Mitsubishi Denki Kabushiki Kaisha, Tokyo, Japan

[21] Appl. No.: 08/622,641

[22] Filed: Mar. 27, 1996

[30] Foreign Application Priority Data

Apr. 20, 1995 [JP] Japan .................................. 7-095222

[51] Int. Cl.$^6$ .................................................. H01L 21/00
[52] U.S. Cl. .......................... 438/723; 438/733; 257/517
[58] Field of Search ............................ 438/712, 719, 438/723, 733; 437/165, 166, 168, 202–205; 257/517, 525, 539, 552

[56] References Cited

U.S. PATENT DOCUMENTS 4,516,145  5/1985  Chang et al. ..................... 438/723 X
5,077,227  12/1991  Kameyama et al. .
5,235,206  8/1993  Desilets et al. .

FOREIGN PATENT DOCUMENTS

| 60-195968 | 10/1985 | Japan . |
| 2-5428 | 1/1990 | Japan . |
| 5-175206 | 7/1993 | Japan . |
| 5-326544 | 12/1993 | Japan . |
| 6-244194 | 9/1994 | Japan . |

*Primary Examiner*—William Powell
*Attorney, Agent, or Firm*—McDermott, Will & Emery

[57] ABSTRACT

A depression having a depth not exceeding 0.1 μm is formed on the surface of an epitaxial layer. An internal base region is formed just below the depression. An external base region is formed outside the depression. The depression having the above depth can suppress electric field at the end of the internal base in the neighborhood of the junction between the internal base region and the external base region.

16 Claims, 6 Drawing Sheets

SEMICONDUCTOR DEVICE AND METHOD OF FABRICATING THE SAME

BACKGROUND OF THE INVENTION

The present invention relates to a semiconductor device and more particularly to a high-speed bipolar transistor.

As a technique of fabricating a semiconductor integrated circuit composed of bipolar transistors and particularly a high-speed device, a method has been proposed in which emitter/base separation is done in a self-aligned manner and an external base region is formed by diffusion from a base electrode made of polysilicon so that the external base region and an internal base region are formed under an optimum condition, respectively.

FIG. 12 is a sectional view showing one example of a structure of the prior art high-speed bipolar transistor. In FIG. 12, reference numeral 1 denotes a semiconductor substrate (hereinafter referred to simply as "substrate") of $P^-$ type silicon (Si) single crystal; 2 an $N^+$ collector embedded layer; 3 a $P^+$ type diffused layer for separation of a lower part; 4 an $N^-$ type epitaxial layer; 5 an N type well region formed in the epitaxial layer 4; and 6 a P type well region formed similarly in the epitaxial layer 4. Reference numeral 7 denotes a field oxide film; 8 a $P^+$ type diffused layer for element isolation formed in an underlying layer of the field oxide film 7; 9 an $N^+$ type collector lead out layer; 10 a base electrode of polysilicon; 11 a $P^+$ type external base region formed by impurity diffusion from the base electrode 10; and 12 a P type internal base region.

Reference numeral 13 denotes an emitter electrode of polysilicon; 14 an $N^+$ type emitter region formed by impurity diffusion from the emitter electrode 13; 15 a side wall oxide film for insulating the base electrode 10 and the emitter electrode 13 from each other; 16 a thin film formed on the surface of the internal base region 12; 17a, 17b and 17c an oxide film, respectively; 18 an inter-layer insulating film; and 19 electrode wiring layers connected to the base electrode 10, emitter electrode 13 and collector lead out layer 9, respectively.

An explanation will be mainly given of active regions of the bipolar transistor having such a configuration as mentioned above.

FIG. 13 is an enlarged view of region A and the periphery thereof in FIG. 12. As seen from the figure, the base electrode 10 and emitter electrode 13, which are made of polysilicon, constitute such a structure as they are insulated in a self-aligned manner from each other using the side wall oxide film 15 (hereinafter referred to as "self-aligned double polysilicon structure").

The bipolar transistor having such a self-aligned type double poly-silicon structure is fabricated by the following process. After a polysilicon film 10a (not shown) constituting the base electrode 10 is formed so as to abut on silicon in the N type well region 5 which is a part of the epitaxial layer 4, oxide films 17a, 17b and 17c are successively formed. Thereafter, the oxide films 17c and 17b within a zone constituting the internal base region 12 are successively etched away. The thin oxide film 16 is formed, and ions are implanted for forming the internal base region 12. After the side wall oxide film 15 is formed, the emitter electrode 13 is formed.

Thus, when etching is effected to form the internal base region in the polysilicon film 10a constituting the base electrode 10, the N type well region 5 is also over-etched because of a small selection ratio for etching between the polysilicon silicon 10a and the underlying N type region 5 (silicon layer), thereby forming a depression 20. Assuming that the depression 20 has a depth of D, as shown in FIG. 13, the internal base region 12 formed just below the depression 20 has a surface height lower by D than that of the external base region 11 formed outside the depression 20.

In this way, in the conventional bipolar transistor, the N type well region 5 is etched by the process margin when the polysilicon film 10a is etched, thereby forming the depression 20. But, the depth of the depression 20 was not managed specially.

On the other hand, in some proposals as disclosed in e.g. Unexamined Published Japanese Patent Application No. SHO. 60-195968, for the purpose of improving the cut-off frequency $f_T$ (i.e. frequency when the gain is 1) of the bipolar transistor by shortening the distance from the internal base region 12 to the collector embedded layer 2, D which exceeds a certain value was set to form the depression 20 having the corresponding depth.

The end of the internal base region 12 which is the neighborhood of the junction with the external base region 11 refers to a link base portion 21. In the conventional bipolar transistor in which the internal base region 12 is formed at a low position by one step, the link base portion 12 has a shape which is not gently sloping horizontally but round. For this reason, the electric field applied to the base/collector junction when the bipolar transistor operates is apt to concentrate at the link base portion so that the electric field applied to the link base portion 21 increases. When the electric field applied to the link base 21 increases, impact ionizing becomes severe, and the hot carriers thus generated will be stored in the thin oxide film 16 and side wall oxide film 15, or boundary between these films and silicon. Further, when the amount of charges stored increases, the emitter/base junction and base/collector junction will be destroyed.

SUMMARY OF THE INVENTION

The present invention has been completed to solve the problems described above, and intends to provide a bipolar transistor with high reliability which can reduce electric field at a link base portion to suppress generation of hot carriers and suppress storage of the hot carriers in oxide films or the boundaries between the oxide films, thereby preventing deterioration such as breakdown of junctions between the base and emitter and between the base and collector.

A semiconductor device of a first aspect of the present invention comprises, in a semiconductor substrate, a collector embedded layer having the first conduction type, an epitaxial layer having the first conduction type formed on the collector embedded layer, a depression formed on the surface of the epitaxial layer, an internal base region having the second conduction type formed on the surface of the epitaxial layer just below the depression, an external base having the second conduction type formed on the surface of the epitaxial layer outside the depression so as to adjoin the internal base region, and an emitter region having the first conduction type formed on the surface of the base region, the depth of the depression formed on the surface of the epitaxial layer not exceeding 0.1 μm.

A method of fabricating a semiconductor device of a second aspect of the present invention comprises the steps of:

growing an epitaxial layer after a collector embedded layer has been formed;

after forming a polysilicon film so as to abut on the surface of the epitaxial layer and an oxide film so as to cover the polysilicon film, etching the oxide film, polysilicon film and the underlying epitaxial layer so that the depth from the surface of the epitaxial layer does not exceed 0.1 µm, thereby forming an opening for an internal base region and also forming a depression on the surface of the epitaxial region and a base electrode made of the polysilicon film;

forming an internal base region just below the depression by ion implantation;

forming an external base region by impurity diffusion from the base electrode;

forming a side wall oxide film on the wall of the opening for forming the internal base region; and forming an emitter region in the internal base region and an emitter electrode made of polysilicon.

A semiconductor device of a third aspect of the present invention comprises, in a semiconductor substrate, a collector embedded layer having the first conduction type, an epitaxial layer having the first conduction type formed on the collector embedded layer, a depression formed on the surface of the epitaxial layer, an internal base region having the second conduction type formed on the surface of the epitaxial layer just below the depression, an external base having the second conduction type formed on the surface of the epitaxial layer outside the depression so as to adjoin the internal base region, and an emitter region having the first conduction type formed on the surface of the base region, and the internal base region is formed by oblique rotary ion implantation so that the extension of the end of the internal base region in a horizontal direction is increased to provide a shape with an increased radius of curvature.

A semiconductor device of a fourth aspect of the present invention is characterized in that the internal base region is formed by oblique rotary ion implantation so that the extension of the end of the internal base region in a horizontal direction is increased to provide a shape with an increased radius of curvature.

A method of fabricating a semiconductor device of a fifth aspect comprises the steps of:

growing an epitaxial layer after a collector embedded layer has been formed;

after having formed a polysilicon film so as to abut on the surface of the epitaxial layer and an oxide film so as to cover the polysilicon film, etching the oxide film, polysilicon film and the underlying epitaxial layer, thereby forming an opening for an internal base region and also forming a depression of the surface of the epitaxial region and a base electrode made of the polysilicon film;

forming an internal base region just below the depression by oblique rotary ion implantation;

forming an external base region by impurity diffusion from the base electrode;

forming a side wall oxide film on the wall of the opening for forming the internal base region to form an emitter electrode; and forming an emitter region in the base region and an emitter electrode made of polysilicon.

A method of fabricating a semiconductor of a sixth aspect is characterized in that the side wall oxide film formed on the wall of the opening for forming the internal base region is formed by thermal CVD at about 800° C. based on reaction of $SiH_4$ and $N_2O$ or $SiCl_2H_2$ and $N_2O$ and the subsequent anisotropic etching.

A method of fabricating a semiconductor device of a seventh aspect comprises the steps of:

growing an epitaxial layer after a collector embedded layer has been formed;

after having formed a polysilicon film so as to abut on the surface of the epitaxial layer and an oxide film so as to cover the polysilicon film, etching the oxide film, polysilicon film and the underlying epitaxial layer, thereby forming an opening for an internal base region and also forming a depression on the surface of the epitaxial region and a base electrode made of the polysilicon film;

forming a thin oxide film having a thickness of 7.0 to 20.0 nm by thermal oxidation and an internal base region just below the depression by ion implantation through the thin oxide film from above the semiconductor substrate;

forming an external base region by impurity diffusion from the base electrode;

forming a side wall oxide film on the wall of the opening for forming the internal base region; and forming an emitter region in the internal base region and an emitter electrode made of polysilicon.

A method of fabricating the semiconductor device of an eighth aspect is characterized in that after the opening for forming the internal base region has been formed, a thin oxide film having a thickness of 7.0 to 20.0 nm is formed by thermal oxidation and an internal base region just below the depression is formed by ion implantation through the thin oxide film from above the semiconductor substrate.

In the semiconductor device according to the present invention, with a depression having a depth not exceeding 0.1 µm in the surface of an epitaxial layer, an internal base region is formed just below the depression and an external base layer is formed outside the depression. Therefore, the level difference between the external base and the internal base region which is lower than it by one step does not exceed 0.1 µm.

While the bipolar transistor operates, the electric field applied to the PN junction between the corrector and the end portion (link base portion) of the internal base region located in the neighborhood of the junction thereof with the external base region increases due to electric field as the depth of the depression increases. According the result of simulation, when the depth of the depression is 0.1 µm, the electric field applied is about $3.6 \times 10^5$ V/cm, and when the former is 0.2 µm, the latter is about $4.0 \times 10^5$ V/cm. The electric field of about $5 \times 10^5$ V/cm causes avalanche breakdown. On the basis of such an experiment result, as a result of the comparison test of continuous operation of the bipolar transistor between the depths of depression of 0.1 µm and 0.2 µm, it was found that the bipolar transistor with the depth of 2 µm exhibits large deterioration and that with the depth of 0.1 µm exhibits high reliability.

From the above test result, in the bipolar transistor with the depth of the depression not exceeding 0.1 µm, electric field at the link base portion is further suppressed so that it is lower than when the depth is 0.1 µm. Thus, generation of hot carriers is suppressed so that the junction breakdown between the emitter and base and between the base and collector, thereby improving the reliability of the bipolar transistor.

In the method of fabricating a semiconductor device according to the present invention, in making an opening for forming the internal base region by etching the polysilicon film constituting the base electrode and the oxide film covering the polysilicon film, the epitaxial layer underlying the polysilicon layer is etched to provide a depression having a depth not exceeding 0.1 μm. In this case, the polysilicon film and the underlying epitaxial layer can be successively etched in the same apparatus. In addition, since the etching rates thereof are substantially equal to each other, the depression having the above depth can be easily formed by controlling the depth. The subsequent formation of the internal base region by ion implantation and the external base region by impurity diffusion from the base electrode can easily provide a base structure with electric field suppressed at the link base portion as described above.

In the semiconductor device according to the present invention, the internal base region is formed by oblique rotary ion implantation to increase an extension of the link base portion in a horizontal direction, thereby providing a shape with an increased radius of curvature. Thus, the electric field at the link base portion can be suppressed to prevent hot carries being generated, thereby improving the reliability of the semiconductor device.

In the semiconductor device according to the present invention, the depression on the epitaxial layer is formed so as to not exceed a depth of 0.1 μm and the internal base region is formed using the oblique rotary ion implantation. Thus, the shape of the link base portion is further gently sloping in a horizontal direction so that electric field is further suppressed to improve the reliability of the semiconductor device.

In the method of fabricating a semiconductor device according to the present invention, the depression of the epitaxial layer is formed simultaneously when the opening for forming the internal base region is so formed that the depression is coincident to the opening. Thereafter, the internal base region is formed by the oblique base region. Thus, the internal base region can be easily formed to have a shape extended in a horizontal direction just below the depression. For this reason, the neighborhood (link base portion) of the junction with the external base region formed outside the depression has a gently sloping shape with an increased radius of curvature, thus easily realizing a base structure with the electric field suppressed.

In the method of fabricating a semiconductor device according to the present invention, the side wall oxide film formed in the wall of the opening for forming the internal base region is made of an oxide film deposited by thermal CVD at about 800° C. by reaction of $SiH_4$ and $N_2O$ or of $SiCl_2H_2$ and $N_2O$. Thus, there is no change in stress in the side wall oxide film due to heat treatment in the subsequent processing.

The interface state between the oxide film and silicon is not increased, and storage of hot carriers in the oxide film or the boundary between the oxide film and the silicon can be suppressed. Thus, deterioration of the semiconductor device such as the junction breakdown between the emitter and base and between the base and collector due to the adverse effect of the hot carriers is prevented, thereby improving the reliability of the semiconductor device.

In the method of fabricating a semiconductor device according to the present invention, after the opening for forming the internal base region has been formed, the thick oxide film having a thickness of 7.0 to 20.0 nm is formed on the silicon surface in the opening by thermal oxidation, ion implantation for forming- the internal base region is carried out from above the semiconductor device. By the etching when forming the opening for forming the internal base region, the epitaxial layer is also etched to form the depression so that a damaged layer due to etching is formed on the silicon surface in the opening. By thermal oxidation, a thin film having a thickness of 7.0 to 20.0 nm is formed. Thus, while maintaining the controllability of the ion implantation in the subsequent processing, the damaged layer due to etching of the silicon surface can be taken in the thin oxide film so that it is removed. An increase in the level between the oxide film and silicon due to the bad influence of the damaged layer is not produced, and the storage of hot carriers due to an increase in the interface state between the oxide film and silicon is suppressed, thereby increasing the reliability of the semiconductor device.

In the method of fabricating a semiconductor device according to the present invention, since such a thin oxide film is formed in addition to formation of the shallow depression of the epitaxial layer, the internal base by the oblique rotary ion implantation or the side wall oxide film by thermal CVD, effects of suppressing generation of hot carriers due to electric field at the link base portion and storage of the hot carriers generated is enhanced to further improve the reliability of the semiconductor device.

DETAILED DESCRIPTION OF THE PREFERRED EMBODIMENTS (Embodiment 1)

An explanation will be given of one embodiment of the present invention. The technique belonging to the prior art will no be explained at discretion.

Figure 1:
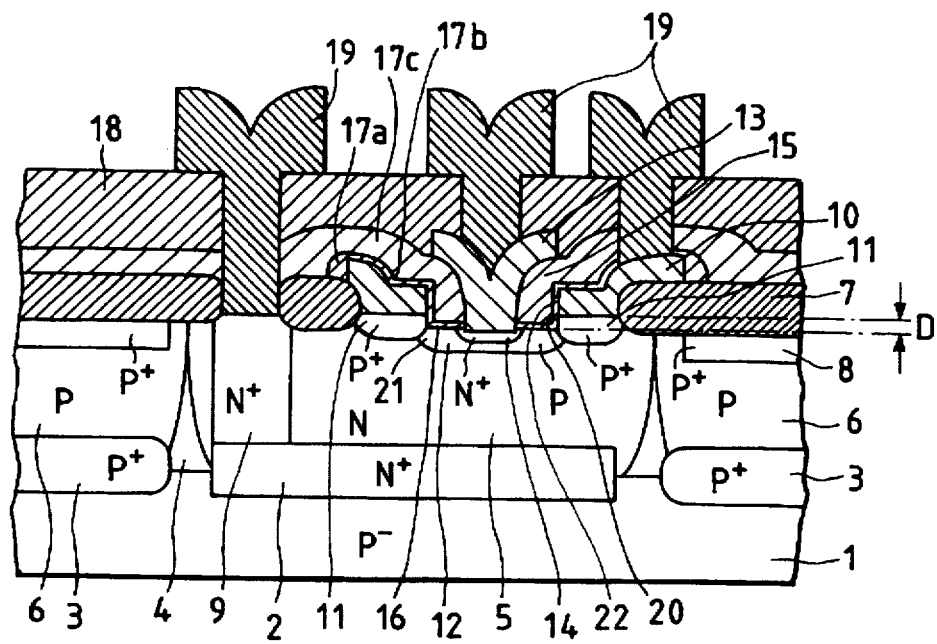
FIG. 1 is a sectional view of the structure of a semiconductor device according to the first embodiment of the present invention.

FIG. 1 is a sectional view showing the structure of a high speed bipolar transistor according to Embodiment 1 of the present invention. In the figure, reference numerals 1 to 21 refer to the conventional components. The depth D of a depression 20 formed in the N type well region 5 which is a part of the epitaxial layer 4 is set for 0.1 µm or less, e.g., 0.08 µm. As shown in FIG. 1, the internal base region 12 is formed just below and the surface height thereof is lower by 0.1 µm or less, e.g., 0.08 µm than that of the external base region 11 formed outside the depression 20.

The bipolar transistor configured thus is fabricated as follows.

First, using a well known method, in a substrate, a collector embedded layer 2 and a P$^+$ type diffusion layer 3 are formed. Thereafter, an epitaxial layer 4 is grown on the entire surface of the layers 2 and 3. An N type well region 5 and a P type well region 6 are formed. Next, a field oxide film 7 for element isolation and P$^+$ type diffusion layer 8 are formed. Further, a collector lead out layer 9 for leading out the collector embedded layer 2 is formed.

Figure 2:
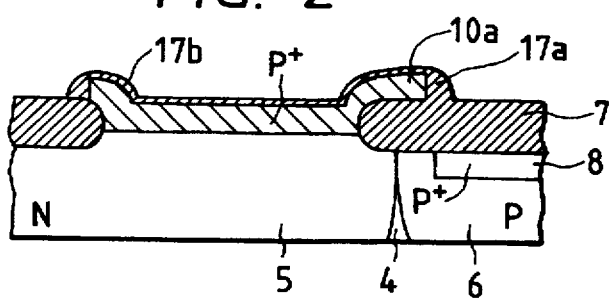
FIG. 2 is a sectional view showing one step in the processing of a semiconductor device according to the first embodiment of the present invention.

Using FIGS. 2 to 7, an explanation will be mainly given of fabrication of active regions of the bipolar transistor. In FIGS. 2 to 7, for convenience of illustration, the layers underlying the epitaxial layer 4 are not shown. On the substrate 1 in which the collector region and the element isolation region, a P$^+$ type polysilicon film 10a having a thickness of about 0.2 µm constituting the base electrode 10 is formed so as to abut on the silicon surface of the N type well region 5, and patterned. On the side wall of the polysilicon film 10a thus patterned, an oxide film 17a is formed. The entire surface is thermally oxidized to form an oxide film 17b (FIG. 2).

Figure 3:
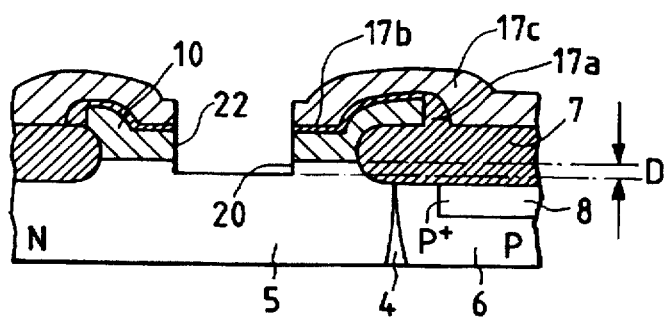
FIG. 3 is a sectional view showing one step in the processing of a semiconductor device according to the first embodiment of the present invention.

An oxide film 17c is deposited on the entire surface by CVD so that the polysilicon film 10a is covered with the oxide films 17a, 17b and 17c. The oxide films 17b and 17c corresponding to the region to be the internal base region 12 are etched away by reactive ion etching (hereinafter referred to as RIE). The underlying polysilicon film 10a is etched by RIE using $CF_4$ gas for e.g., 46 to 47 sec so that a base electrode 10 as well as an opening 22 for forming the internal base region 12 are formed. In this case, since both polysilicon film 10a and silicon layer have an etching rate of about 6.0 nm/sec, during the etching, the polysilicon film 10a having a thickness of about 0.2 µm is etched away and the silicon layer of the underlying N type well region 5 is etched to a depth of about 0.08 µm to form a depression 20 (FIG. 3).

Figure 4:
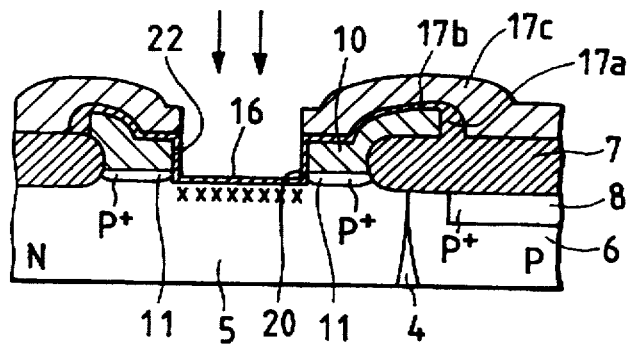
FIG. 4 is a sectional view showing one step in the processing of a semiconductor device according to the first embodiment of the present invention.

By thermal oxidation, a thin oxide film 16 is formed on the side wall of the base electrode 10 exposed in the opening 22 and the silicon surface of the depression 20. Because of the heat treatment, impurities are slightly diffused into the N type well region 5 from the base electrode 10. Thereafter, from above the substrate 1, B ions or $BF_2$ ions are implanted for forming the internal base region 12 (FIG. 4).

Figure 5:
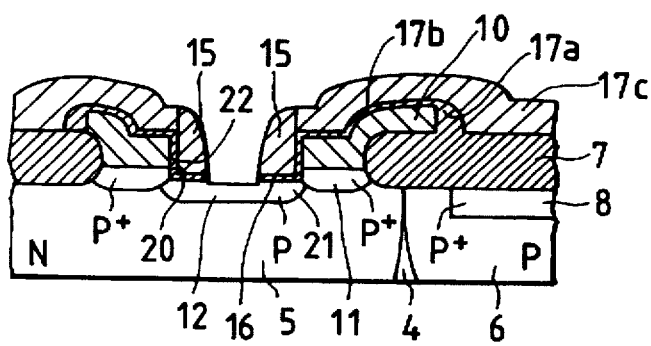
FIG. 5 is a sectional view showing one step in the processing of a semiconductor device according to the first embodiment of the present invention.

After an oxide film has been deposited on the entire surface by CVD, a side wall oxide film 15 is formed on the side wall of the opening 22 by RIE. In this case, because of the heat treatment in forming the oxide film by CVD, the impurity ions implanted already are activated to form the internal base region 12 and the impurity diffusion from the base electrode 10 into the N type well region 5 further advances to form the external base region 11 (FIG. 5).

Figure 6:
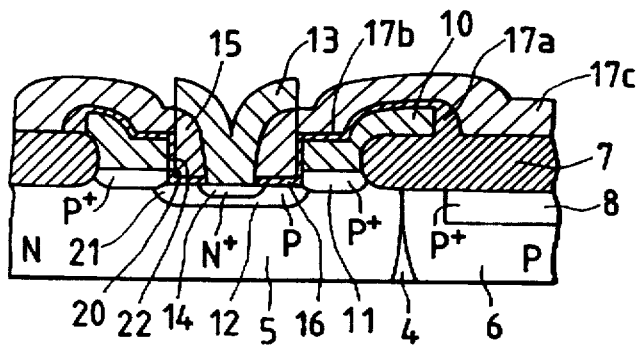
FIG. 6 is a sectional view showing one step in the processing of a semiconductor device according to the first embodiment of the present invention.

A polysilicon film containing a large quantity of N type impurities is formed on the entire surface so as to be embedded in the opening 22. The polysilicon film is patterned to form an emitter electrode 13. Subsequently, the substrate 1 is heat-treated so that an emitter region 14 is formed by impurity diffusion from the emitter electrode 13. Alternatively, the emitter electrode 13 may be formed after the emitter region 14 is first formed by impurity introduction such as ion implantation (FIG. 6).

Figure 7:
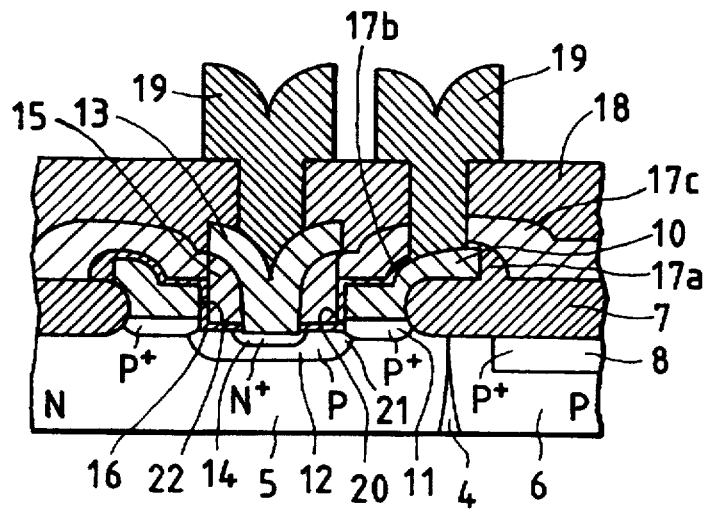
FIG. 7 is a sectional view showing one step in the processing of a semiconductor device according to the first embodiment of the present invention.

An inter-layer 18 is deposited on the entire surface and contact holes are formed. Thereafter, through the contact holes, electrode wiring layers 19 are formed which are to be connected to the base electrode 10, emitter electrode 13 and collector lead out layer 9 shown in only FIG. 1 (FIG. 7).

Thereafter, predetermined treatments are made to complete a bipolar transistor.

In Embodiment 1, the depth D of the depression 20 formed in the N type well region 5 is 0.08 µm which is not larger than 0.1 µm.

Figure 8:
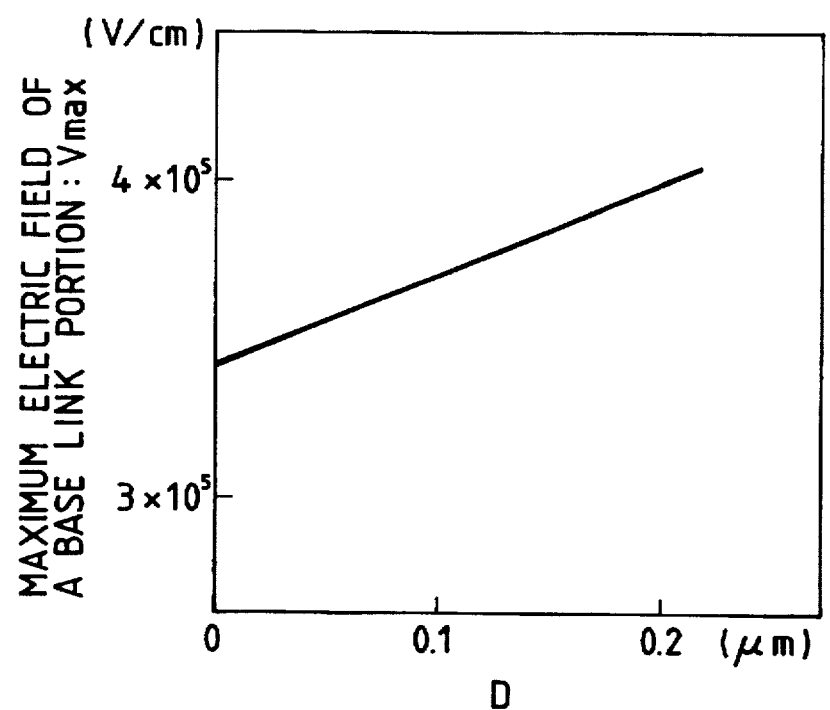
FIG. 8 is a graph showing the relationship between the depth of a depression of the epitaxial layer and an electric field.

Now, the electric field applied to the PN junction between the link base portion 21 and the collector simulated while the bipolar transistor operates is shown in a graph of FIG. 8. As seen from the graph, as the value of D increases, electric field occurs at the link base portion 21 so that it is strengthened. For example, the electric field applied to the link base portion 21 is about $3.6 \times 10^5$ V/cm when D=0.1 µm and it is about $4.0 \times 10^5$ V/cm when D=0.2 µm. On the other hand, the impurity concentration of the internal base region 12 is about $10^{17}$ cm$^{-3}$ and hence avalanche breakdown occurs in the electric field of about $5 \times 10^5$ V/cm. Therefore, in the neighborhood of this electric field, impact ionizing becomes severe so that bad influence due to hot carriers becomes large.

In two kinds of bipolar transistors of D=0.1 µm and D=0.2 µm, continuous operating test of the bipolar transistor at a collector current of 100 µA was carried out. As a result, the bipolar transistor with D=0.2 µm has a current amplification factor (hFE) deteriorated by 30% whereas that with D=0.1 µm does not experience such deterioration.

Thus, it was found that in the bipolar transistor with D=0.1 µm in which the electric field applied to the link base portion 21 is about $3.6 \times 10^5$ V/cm, generation of hot carriers due to impact ionizing is suppressed so that the bipolar transistor does not deteriorate. In the first embodiment described above, since D is set at 0.08 µm that is smaller than 0.1 µm, the electric field applied to the link base portion 21 can be further reduced, i.e., electric field at the link base portion 21 can be suppressed, thereby preventing deterioration such as junction breakdown due to the adverse effect of hot carriers.

The depression 20 formed in the N type well region 5 is formed simultaneously with the opening 22 for forming the internal base region 12. Therefore, if the etching time of the polysilicon film 10a constituting the base electrode 10 is lengthened slightly, the surface of the N type well region 5 is etched to a depth of e.g., 0.08 µm at an etching rate substantially equal to that of the polysilicon film 10a, thus easily forming the depression 20. Thereafter, the internal base region 12 is formed by ion implantation, and the external base electrode 11 is formed by impurity diffusion from the base electrode 10. Thus, the base structure having the link base portion 21 with the suppressed electric field can be easily formed.

(Embodiment 2)

Now referring to FIG. 9, the bipolar transistor according to the second embodiment of the present invention will be explained. For convenience of illustration, FIG. 9 does not also show the portion underlying the epitaxial layer 4 as in the first embodiment.

Figure 9A:
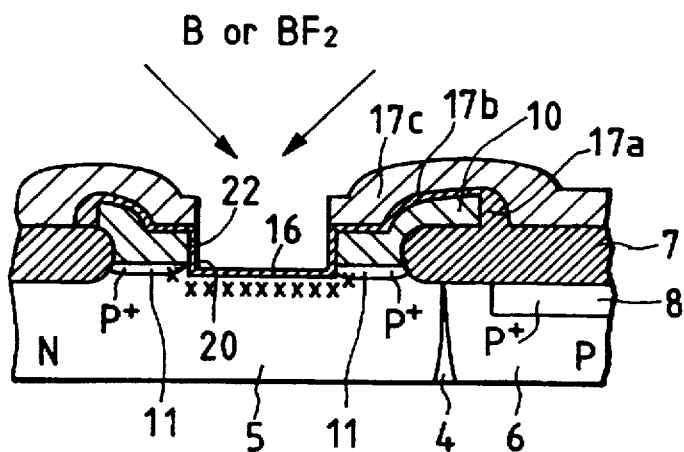
FIGS. 9A to 9C are sectional views showing the structure of a semiconductor device according to the second embodiment of the present invention and the method of fabricating thereof.

The bipolar transistor according to the second embodiment was fabricated as follows. As in the first embodiment, after the depression 20 is formed in the N type well region 5 (FIG. 3), the thin oxide film 16 is formed (FIG. 3). Thereafter, B ions or $BF_2$ ions for forming the internal base region 12a is implanted by oblique rotary ion implantation (FIG. 9A). As in the first embodiment, the side wall oxide film 15 is formed (FIG. 9B) and the same processing as in the first embodiment is made to complete a bipolar transistor (FIG. 9C).

Figure 9B:
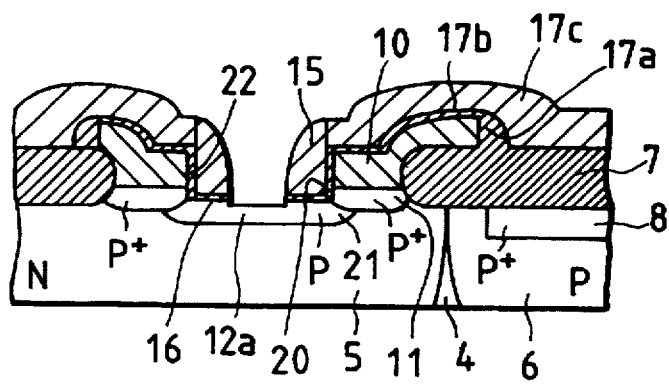
Figure 9C:
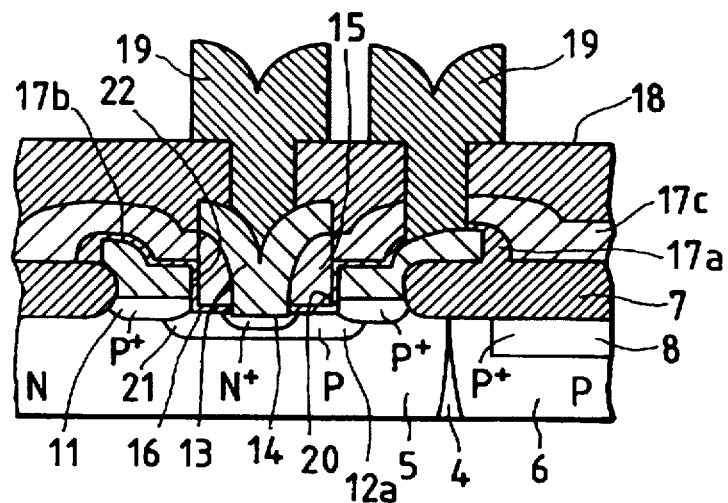

In this way, since the internal base region 12a is formed through the oblique rotary ion implantation, the internal base region 12a formed by the heat treatment in forming the side wall oxide film 15 has a shape with the end (link base portion 21) gently sloping horizontally so as to increase a radius of curvature as shown in FIGS. 9B and 9C so that electric field to the link base portion 21 is suppressed. Thus, the adverse effect of hot carriers can be prevented more surely.

The oblique rotary ion implantation for forming the internal base region 12a can be used also when the depth of the depression 20 formed in the N type well region 5 exceeds 0.1 μm. This can suppress the electric field applied to the link base portion 21 as compared with the ordinary ion implantation, thereby improving the reliability of the bipolar transistor.

(Embodiment 3)

Figure 10:
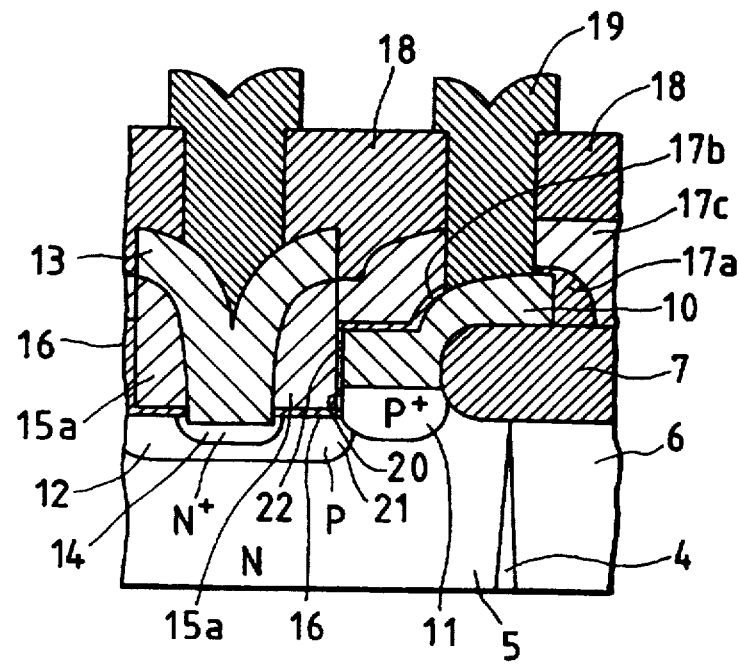
FIG. 10 is a sectional view showing a method of fabricating a semiconductor device according to the present invention.

Referring to FIG. 10, an explanation will be given of the bipolar transistor according to the third embodiment of the present invention. For convenience of illustration, FIG. 10 does not also show the portion underlying the epitaxial layer 4.

The side wall oxide film 15a in the bipolar transistor according to this embodiment of the present invention is an oxide film deposited through thermal CVD at about 800° C. by the reaction of $SiH_4$ and $N_2O$, or $SiCl_2H_2$ and $N_2O$. As in the first embodiment, the side wall oxide film 15a is formed by RIE etching the oxide film formed on the entire surface by the thermal CVD. But, since the side wall oxide film is heat-treated subsequently, a problem of stress occurs. For example, when a TEOS (Tetrathyl orthosilicate) film is used, tensile stress generated in deposition changes into compressive stress. Such a change in stress produces stress in the underlying silicon layer, increases the interface state between the oxide film and the silicon, and leads to easy generation of hot carriers in the oxide films and an oxide film/silicon boundary.

In the third embodiment, the side wall oxide film 15a, which includes an oxide film deposited by thermal CVD at about 800° C., provides stable stress without being influenced by the subsequent heat treatment. This leads to a structure in which hot carriers deteriorating the bipolar transistor are hard to be stored, thereby improving reliability of the bipolar transistor.

(Embodiment 4)

Figure 11:
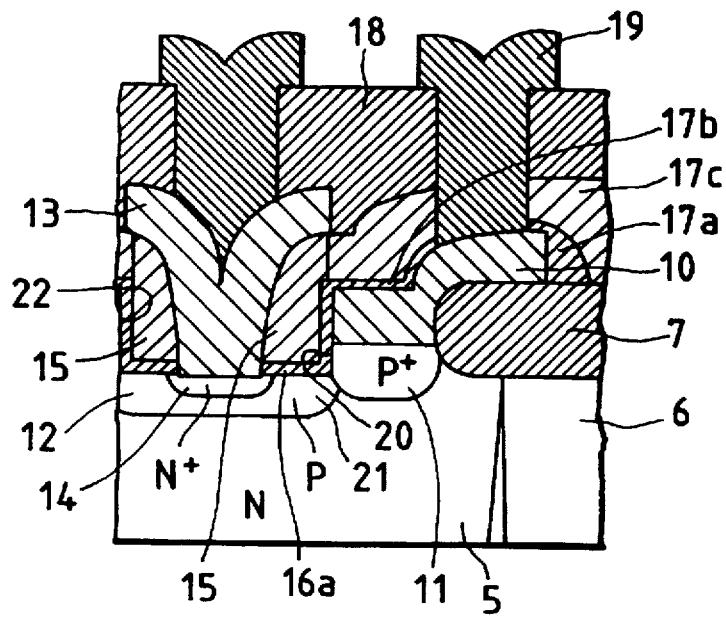
FIG. 11 is a sectional view showing a method of fabricating a semiconductor device according to the fourth embodiment of the present invention.
Figure 12:
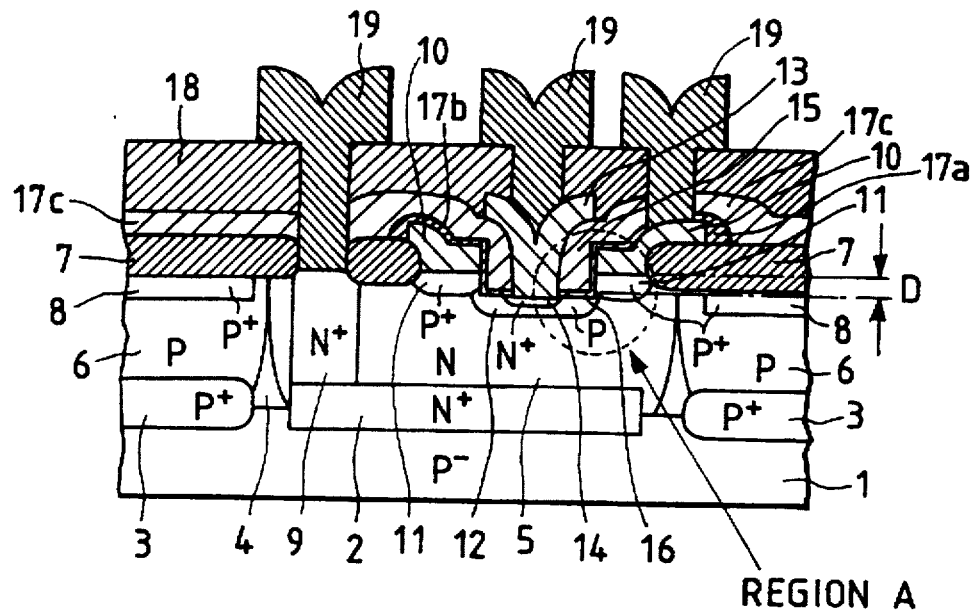
FIG. 12 is a sectional view showing the structure of the conventional semiconductor device.
Figure 13:
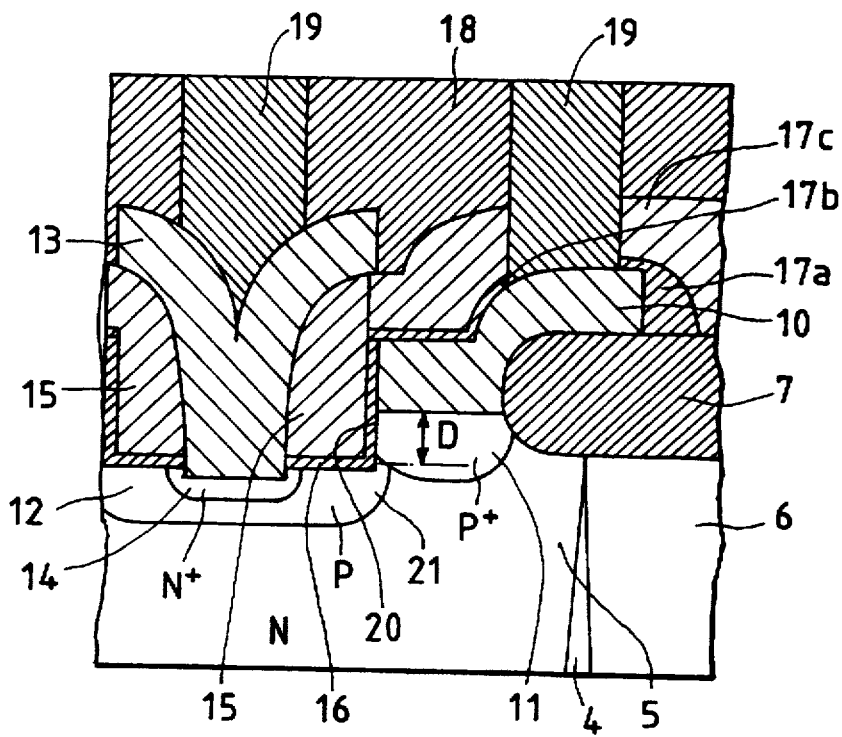
FIG. 13 is a partially enlarged view of FIG. 12.

Referring to FIG. 11, an explanation will be given of the bipolar transistor according to the fourth embodiment. For convenience of illustration, FIG. 11 does not also illustrate the portion underlying the epitaxial layer 4.

In the bipolar transistor according to this embodiment, the thin oxide film 16a on the surface of the internal base region 12 is formed to have a thickness of 7.0 to 20.0 nm. As in the first embodiment, this thin oxide film 16a is formed by thermal oxidation after the opening 22 used for forming the internal base region 12 and before the ion implantation for forming the internal base region 12. The RIE etching when the opening portion 22 is formed also etches the silicon layer of the N type well region 5 to form the depression 20. This will provide a damaged layer having a thickness of 5.0 to 10.0 nm on the silicon surface in the depression 20. The damaged layer on the silicon surface may increase the interface state between the oxide film and silicon.

On the other hand, in the ion-implantation for forming the internal base region 12, impurity ions are implanted through the thin oxide film 16a. In this case, in order to control the depth of implantation of the internal base region 12 while maintaining the high frequency of the bipolar transistor, it is desirable to decrease dispersion by reducing implantation energy. The thickness of the thin oxide film 16a, therefore, is desired to be as possible as thin.

In the fourth embodiment, since the thin oxide film 16a is formed to have a thickness of 7.0 to 20.0 nm, during the thermal oxidation for forming thereof, the damaged layer by etching of the silicon surface can be taken in the thin oxide film 16a. In addition, the thickness of the thin film 16a is not made thicker than is not necessary so as deteriorate dispersion of the high frequency characteristic in ion implantation for forming the internal base region 12. Thus, the damaged layer of the silicon surface which gives rise to an increase in the interface state between the oxide film and silicon can be removed. This results in a structure in which hot carriers deteriorating the bipolar transistor are hard to be stored.

The structure with the thin oxide film having a thickness of 7.0 to 20.0 nm can be used also when the depth D of the depression 20 formed in the N type well region 5 exceeds 0.1 μm, thereby suppressing hot carriers generated from being stored in the oxide film or the boundary between the oxide film and silicon.

The second and third embodiments can be simultaneously used to improve the reliability.

As described above, in accordance with the present invention, with a depression having a depth not exceeding 0.1 μm in an epitaxial layer, an internal base region is formed just below the depression and an external base layer is formed outside the depression. For this reason, a semiconductor device with improved reliability is provided which suppresses electric field at the link base to suppress hot carriers from being generated and prevents deterioration such as junction breakdown due to the adverse effect of hot carriers.

In accordance with the present invention, when the opening for forming the internal base region is formed, the epitaxial layer underlying the polysilicon layer constituting the base electrode is etched so as to have a depth not exceeding 0.1 μm, thereby forming the depression. Thereafter, the internal base region is formed by ion implantation, and the external base region is formed by impurity diffusion from the base electrode. Thus, electric field at the link base portion is suppressed so as to provide a reliable semiconductor device.

In accordance with the present invention, the internal base region is formed by oblique rotary ion implantation to increase an extension of the link base portion in a horizontal direction, thereby providing a shape with an increased radius of curvature. Thus, electric field at the link base portion is suppressed to prevent hot carries from being generated, thereby providing a reliable semiconductor device which can prevent deterioration such as junction breakdown due to the adverse effect of the hot carriers.

In accordance with the present invention, the depression of the epitaxial layer is formed so as to not exceed a depth of 0.1 μm and the internal base region is formed using the oblique rotary ion implantation. Thus, the shape of the link base portion is further gently sloping in a horizontal direction so that electric field is further suppressed to improve the reliability of the semiconductor device.

In accordance with the present invention, the depression of the epitaxial layer is formed simultaneously when the opening for forming the internal base region is formed and thereafter the internal base region is formed by the oblique rotary ion implantation. Thus, the internal base region can be easily formed to have a shape extended in a horizontal direction just below the depression so that electric field is suppressed, thereby providing a reliable semiconductor device.

In accordance with the present invention, the side wall oxide film formed in the wall of the opening for forming the internal base region is made of an oxide film deposited by thermal CVD at about 800° C. by reaction of $SiH_4$ and $N_2O$ or of $SiCl_2H_2$ and $N_2O$. Thus, there is no change in stress due to heat treatment in the subsequent processing so that storage of hot carriers due to an increase in the interface state between the oxide film and silicon is suppressed, thereby increasing the reliability of the semiconductor device.

In accordance with the present invention, after the thick oxide film having a thickness of 7.0 to 20.0 nm is formed on the silicon surface in the opening for forming the internal base region by thermal oxidation, ion implantation for forming the internal base region is carried out. Thus, while maintaining the controllability of the ion implantation, the damaged layer due to the etching when the opening is formed can be taken in the thin oxide film. The storage of hot carriers due to an increase in the interface state between the oxide film and silicon is suppressed, thereby increasing the reliability of the semiconductor device.

Since such a thin oxide film is formed in addition to formation of the shallow depression of the epitaxial layer, the internal base by the oblique rotary ion implantation or the side wall oxide film by thermal CVD, effects of suppressing generation of hot carriers due to electric field at the link base portion and storage of the hot carriers generated is enhanced to improve the reliability of the semiconductor device.

What is claimed is:

1. A semiconductor device, comprising:
   a semiconductor substrate;
   a collector embedded layer of a first conduction type formed on said semiconductor substrate;
   an epitaxial layer of a first conduction type formed on said collector embedded layer;
   a depression formed on a surface of said epitaxial layer, a depth of said depression formed on a surface of said epitaxial layer not exceeding 0.1 μm;
   an internal base region of a second conduction type formed on a surface of said epitaxial layer just below said depression;
   an external base of a second conduction type formed on a surface of said epitaxial layer outside of said depression so as to adjoin said internal base region; and
   an emitter region of a first conduction type formed on a center surface of said base region.

2. A method of fabricating a semiconductor device, comprising the steps of:
   growing an epitaxial layer after forming a collector embedded layer in a semiconductor substrate;
   forming a polysilicon film so as to abut on a surface of said epitaxial layer and an oxide film so as to cover said polysilicon film;
   etching said oxide film, said polysilicon film, and said underlying epitaxial layer so that a depth from a surface of said epitaxial layer does not exceed 0.1 μm, thereby forming an opening for an internal base region and also forming a depression of a surface of said epitaxial region and a base electrode made of said polysilicon film;
   forming an internal base region just below said depression by ion implantation;
   forming an external base region by impurity diffusion from said base electrode;
   forming a side wall oxide film on a wall of said opening for forming said internal base region; and
   forming an emitter region in said internal base region and an emitter electrode made of polysilicon.

3. A semiconductor device, comprising:
   a semiconductor substrate;
   a collector embedded layer of a first conduction type;
   an epitaxial layer of a first conduction type formed on said collector embedded layer;
   a depression formed on a surface of said epitaxial layer;
   an internal base region of a second conduction type formed on a surface of said epitaxial layer just below said depression, said internal base region being formed by oblique rotary ion implantation so that an extension of an end of said internal base region in a horizontal direction is increased to provide a shape with an increased radius of curvature;
   an external base of a second conduction type formed on a surface of said epitaxial layer outside said depression so as to adjoin said internal base region; and
   an emitter region of a first conduction type formed on a center surface of said base region.

4. The semiconductor device of claim 1, wherein said internal base region is formed by oblique rotary ion implantation so that an extension of an end of said internal base region in a horizontal direction is increased to provide a shape with an increased radius of curvature.

5. The method of fabricating the semiconductor device of claim 3, comprising the steps of:
   growing an epitaxial layer after forming a collector embedded layer in a semiconductor substrate;
   forming a polysilicon film so as to abut on a surface of said epitaxial layer and forming an oxide film so as to cover said polysilicon film;
   etching said oxide film, said polysilicon film, and said underlying epitaxial layer, thereby forming an opening for an internal base region and also forming a depression of a surface of said epitaxial region and a base electrode made of said polysilicon film;
   forming an internal base region just below said depression by oblique rotary ion implantation;
   forming an external base region by impurity diffusion from said base electrode;
   forming a side wall oxide film on a wall of said opening for forming said internal base region to form an emitter electrode made of polysilicon; and
   forming an emitter region in said base region and an emitter electrode made of polysilicon.

6. The method of fabricating the semiconductor device of claim 4, comprising the steps of:
   growing an epitaxial layer after forming a collector embedded layer in a semiconductor substrate;
   forming a polysilicon film so as to abut on a surface of said epitaxial layer and forming an oxide film so as to cover said polysilicon film;
   etching said oxide film, said polysilicon film, and said underlying epitaxial layer, thereby forming an opening for an internal base region and also forming a depression of a surface of said epitaxial region and a base electrode made of said polysilicon film;
   forming an internal base region just below said depression by oblique rotary ion implantation;

forming an external base region by impurity diffusion from said base electrode;

forming a side wall oxide film on a wall of said opening for forming said internal base region to form an emitter electrode made of polysilicon; and forming an emitter region in said base region and an emitter electrode made of polysilicon.

7. The method of fabricating the semiconductor of claim 2, wherein a side wall oxide film formed on a wall of said opening for forming said internal base region is formed by thermal CVD deposition at about 800° C. based on reaction of $SiH_4$ and $N_2O$, or $SiCl_2H_2$ and $N_2O$, and a subsequent anisotropic etching.

8. The method of fabricating the semiconductor of claim 5, wherein a side wall oxide film formed on a wall of said opening for forming said internal base region is formed by thermal CVD deposition at about 800° C. based on reaction of $SiH_4$ and $N_2O$, or $SiCl_2H_2$ and $N_2O$, and a subsequent anisotropic etching.

9. The method of fabricating the semiconductor of claim 6, wherein a side wall oxide film formed on a wall of said opening for forming said internal base region is formed by thermal CVD deposition at about 800° C. based on reaction of $SiH_4$ and $N_2O$, or $SiCl_2H_2$ and $N_2O$, and a subsequent anisotropic etching.

10. A method of fabricating a semiconductor device, comprising the steps of:

growing an epitaxial layer after forming a collector embedded layer in a semiconductor substrate;

forming a polysilicon film so as to abut on a surface of said epitaxial layer and an oxide film so as to cover said polysilicon film;

etching said oxide film, polysilicon film and said underlying epitaxial layer, thereby forming an opening for an internal base region and also forming a depression on a surface of said epitaxial region and a base electrode made of said polysilicon film;

forming a thin oxide film having a thickness of 7.0 to 20.0 nm by thermal oxidation and forming an internal base region just below said depression by ion implantation through said thin oxide film from above said semiconductor substrate;

forming an external base region by impurity diffusion from said base electrode;

forming a side wall oxide film on a wall of said opening for forming said internal base region; and forming an emitter region in said internal base region and an emitter electrode made of polysilicon.

11. The method of fabricating the semiconductor device of claim 2, wherein after forming said opening for forming said internal base region, a thin oxide film having a thickness of 7.0 to 20.0 nm is formed by thermal oxidation and an internal base region just below said depression is formed by ion implantation through said thin oxide film from above said semiconductor substrate.

12. The method of fabricating the semiconductor device of claim 5, wherein after forming said opening for forming said internal base region, a thin oxide film having a thickness of 7.0 to 20.0 nm is formed by thermal oxidation and an internal base region just below said depression is formed by ion implantation through said thin oxide film from above said semiconductor substrate.

13. The method of fabricating the semiconductor device of claim 6, wherein after forming said opening for forming said internal base region, a thin oxide film having a thickness of 7.0 to 20.0 nm is formed by thermal oxidation and an internal base region just below said depression is formed by ion implantation through said thin oxide film from above said semiconductor substrate.

14. The method of fabricating the semiconductor device of claim 7, wherein after forming said opening for forming said internal base region, a thin oxide film having a thickness of 7.0 to 20.0 nm is formed by thermal oxidation and an internal base region just below said depression is formed by ion implantation through said thin oxide film from above said semiconductor substrate.

15. The method of fabricating the semiconductor device of claim 8, wherein after forming said opening for forming said internal base region, a thin oxide film having a thickness of 7.0 to 20.0 nm is formed by thermal oxidation and an internal base region just below said depression is formed by ion implantation through said thin oxide film from above said semiconductor substrate.

16. The method of fabricating the semiconductor device of claim 9, wherein after forming said opening for forming said internal base region, a thin oxide film having a thickness of 7.0 to 20.0 nm is formed by thermal oxidation and an internal base region just below said depression is formed by ion implantation through said thin oxide film from above said semiconductor substrate.

* * * * *